(12) United States Patent
Oh et al.

(10) Patent No.: US 7,863,748 B2
(45) Date of Patent: Jan. 4, 2011

(54) SEMICONDUCTOR CIRCUIT AND METHOD OF FABRICATING THE SAME

(76) Inventors: ChoonSik Oh, Hyundai Prime Apt. 12-901, Kuyee 3-dong, Kwangjin-gu, Seoul (KR) 143-761; Lee Sang-Yun, 17082 NW. Elk Run Dr., Beaverton, OR (US) 97006

( * ) Notice: Subject to any disclaimer, the term of this patent is extended or adjusted under 35 U.S.C. 154(b) by 122 days.

(21) Appl. No.: 12/397,309

(22) Filed: Mar. 3, 2009

(65) Prior Publication Data

US 2009/0224364 A1 Sep. 10, 2009

Related U.S. Application Data

(63) Continuation-in-part of application No. 12/040,642, filed on Feb. 29, 2008, now Pat. No. 7,800,199, and a continuation-in-part of application No. 11/873,719, filed on Oct. 17, 2007, and a continuation-in-part of application No. 11/873,851, filed on Oct. 17, 2007, and a continuation-in-part of application No. 11/873,769, filed on Oct. 17, 2007, and a continuation-in-part of application No. 11/606,523, filed on Nov. 30, 2006, and a continuation-in-part of application No. 11/378,059, filed on Mar. 17, 2006, and a continuation-in-part of application No. 11/180,286, filed on Jul. 12, 2005, and a continuation-in-part of application No. 11/092,498, filed on Mar. 29, 2005, now Pat. No. 7,470,142, and a continuation-in-part of application No. 11/092,499, filed on Mar. 29, 2005, now Pat. No. 7,470,598, and a continuation-in-part of application No. 11/092,521, filed on Mar. 29, 2005, and a continuation-in-part of application No. 11/092,500, filed on Mar. 29, 2005, and a continuation-in-part of application No. 11/092,501, filed on Mar. 29, 2005, and a continuation-in-part of application No. 10/873,969, filed on Jun. 21, 2004, now Pat. No. 7,052,941.

(30) Foreign Application Priority Data

| Jun. 24, 2003 | (KR) | ................. 10-2003-0040920 |
| Jul. 12, 2003 | (KR) | ................. 10-2003-0047515 |
| Jun. 11, 2004 | (KR) | ................. 10-2004-0042830 |

(51) Int. Cl.
   *H01L 27/10* (2006.01)
(52) U.S. Cl. .......................... 257/758; 257/E23.001
(58) Field of Classification Search ................ 257/758, 257/E23.001, E23.141; 438/637
   See application file for complete search history.

(56) References Cited

U.S. PATENT DOCUMENTS

| 4,704,785 A | 11/1987 | Curran |
| 4,829,018 A | 5/1989 | Wahlstrom |
| 4,939,568 A | 7/1990 | Kato et al. |

(Continued)

*Primary Examiner*—Thao P. Le
(74) *Attorney, Agent, or Firm*—Schmeiser Olsen & Watts LLP

(57) ABSTRACT

A bonded semiconductor structure includes a support substrate which carries a first electronic circuit, and an interconnect region carried by the support substrate. The interconnect region includes a capacitor and conductive line in communication with the first electronic circuit. The circuit includes a bonding layer carried by the interconnect region, and a bonded substrate coupled to the interconnect region through the bonding layer.

24 Claims, 11 Drawing Sheets

U.S. PATENT DOCUMENTS

| | | |
|---|---|---|
| 5,087,585 A | 2/1992 | Hayashi |
| 5,093,704 A | 3/1992 | Saito et al. |
| 5,106,775 A | 4/1992 | Kaga et al. |
| 5,152,857 A | 10/1992 | Ito et al. |
| 5,266,511 A | 11/1993 | Takao |
| 5,308,782 A | 5/1994 | Mazure et al. |
| 5,355,022 A | 10/1994 | Sugahara et al. |
| 5,554,870 A | 9/1996 | Fitch et al. |
| 5,627,106 A | 5/1997 | Hsu |
| 5,695,557 A | 12/1997 | Yamagata et al. |
| 5,737,748 A | 4/1998 | Shigeeda |
| 5,829,026 A | 10/1998 | Leung et al. |
| 5,835,396 A | 11/1998 | Zhang |
| 5,892,225 A | 4/1999 | Okihara |
| 5,915,167 A | 6/1999 | Leedy |
| 5,977,579 A | 11/1999 | Noble |
| 5,980,633 A | 11/1999 | Yamagata et al. |
| 5,998,808 A | 12/1999 | Matsushita |
| 6,009,496 A | 12/1999 | Tsai |
| 6,153,495 A | 11/2000 | Kub et al. |
| 6,222,251 B1 | 4/2001 | Holloway |
| 6,229,161 B1 | 5/2001 | Nemati et al. |
| 6,331,468 B1 | 12/2001 | Aronowitz et al. |
| 6,531,697 B1 | 3/2003 | Nakamura et al. |
| 6,534,382 B1 | 3/2003 | Sakaguchi et al. |
| 6,535,411 B2 | 3/2003 | Jolin et al. |
| 6,600,173 B2 | 7/2003 | Tiwari |
| 6,621,168 B2 | 9/2003 | Sundahl et al. |
| 6,630,713 B2 | 10/2003 | Geusic |
| 6,677,204 B2 | 1/2004 | Cleeves et al. |
| 6,742,067 B2 | 5/2004 | Hsien |
| 6,751,113 B2 | 6/2004 | Bhakta et al. |
| 6,787,920 B2 | 9/2004 | Amir |
| 6,822,233 B2 | 11/2004 | Nakamura et al. |
| 6,854,067 B1 | 2/2005 | Kutz et al. |
| 6,943,067 B2 | 9/2005 | Greenlaw |
| 6,943,407 B2 | 9/2005 | Ouyang et al. |
| 6,995,430 B2 | 2/2006 | Langdo et al. |
| 7,002,152 B2 | 2/2006 | Grunewald |
| 7,078,739 B1 | 7/2006 | Nemati et al. |
| 2002/0024140 A1* | 2/2002 | Nakajima et al. ............ 257/758 |
| 2002/0025604 A1* | 2/2002 | Tiwari ........................ 438/118 |
| 2002/0141233 A1 | 10/2002 | Hosotani et al. |
| 2003/0067043 A1 | 4/2003 | Zhang |
| 2003/0113963 A1 | 6/2003 | Wurzer |
| 2003/0139011 A1 | 7/2003 | Cleeves et al. |
| 2004/0113207 A1 | 6/2004 | Hsu et al. |
| 2004/0131233 A1 | 7/2004 | Comaniciu et al. |
| 2004/0155301 A1 | 8/2004 | Zhang |
| 2004/0156233 A1 | 8/2004 | Bhattacharyya |
| 2004/0160849 A1 | 8/2004 | Rinerson et al. |
| 2005/0218521 A1* | 10/2005 | Lee ............................ 257/758 |
| 2007/0262457 A1* | 11/2007 | Lin ............................ 257/758 |

* cited by examiner

SEMICONDUCTOR CIRCUIT AND METHOD OF FABRICATING THE SAME

CROSS-REFERENCE TO RELATED APPLICATIONS

This application claims the benefit of Korean Patent Application No. 10-2004-0042830, filed on Mar. 3, 2008, the contents of which are incorporated herein by reference.

This application is a continuation-in-part of, and claims the benefit of, U.S. patent application Ser. Nos.:

Ser. No. 12/040,642, filed on Feb. 29, 2008,
Ser. No. 11/092,498, filed on Mar. 29, 2005,
Ser. No. 11/092,499, filed on Mar. 29, 2005,
Ser. No. 11/092,500, filed on Mar. 29, 2005,
Ser. No. 11/092,501, filed on Mar. 29, 2005;
Ser. No. 11/092,521, filed on Mar. 29, 2005;
Ser. No. 11/180,286, filed on Jul. 12, 2005;
Ser. No. 11/378,059, filed on Mar. 17, 2006; and
Ser. No. 11/606,523, filed on Nov. 30, 2006;

which in turn are continuation-in-parts of, and claim the benefit of, U.S. patent application Ser. No. 10/873,969 (now U.S. Pat. No. 7,052,941), filed on Jun. 21, 2004, which claims the benefit of Republic of Korea Patent Application Nos. 10-2003-0040920 and 10-2003-0047515, filed on Jun. 24, 2003 and Jul. 12, 2003, respectively, the contents of all of which are incorporated herein by reference in their entirety.

This is also a continuation-in-part of, and claims the benefit of, U.S. patent application Ser. Nos.:

Ser. No. 11/873,719, filed on Oct. 17, 2007; and
Ser. No. 11/873,851, filed on Oct. 17, 2007;

which in turn are divisionals of, and claim the benefit of, U.S. patent application Ser. No. 10/092,521, which is a continuation-in-part of, and claims the benefit of, U.S. patent application Ser. No. 10/873,969 (now U.S. Pat. No. 7,052,941), filed on Jun. 21, 2004, which claims the benefit of Republic of Korea Patent Application Nos. 10-2003-0040920 and 10-2003-0047515, filed on Jun. 24, 2003 and Jul. 12, 2003, respectively, the contents of both of which are incorporated herein by reference in their entirety.

This is also a continuation-in-part of, and claims the benefit of, U.S. patent application Ser. No. 11/873,769, filed on Oct. 17, 2007, which in turn is a divisional of, and claims the benefit of, U.S. patent application Ser. No. 10/092,500, which is a continuation-in-part of, and claims the benefit of, U.S. patent application Ser. No. 10/873,969 (now U.S. Pat. No. 7,052,941), filed on Jun. 21, 2004, which claims the benefit of Republic of Korea Patent Application Nos. 10-2003-0040920 and 10-2003-0047515, filed on Jun. 24, 2003 and Jul. 12, 2003, respectively, the contents of both of which are incorporated herein by reference in their entirety.

BACKGROUND OF THE INVENTION

1. Field of the Invention

This invention relates to bonded semiconductor structures formed using bonding.

2. Description of the Related Art

Advances in semiconductor manufacturing technology have provided computer systems with integrated circuits that include many millions of active and passive electronic devices, along with the interconnects to provide the desired circuit connections. A typical computer system includes a computer chip, with processor and control circuits, and an external memory chip. As is well-known, most integrated circuits include laterally oriented active and passive electronic devices that are carried on a single major surface of a substrate. The current flow through laterally oriented devices is generally parallel to the single major surface of the substrate. Active devices typically include transistors and passive devices typically include resistors, capacitors, and inductors. However, these laterally oriented devices consume significant amounts of chip area. Sometimes laterally oriented devices are referred to as planar or horizontal devices. Examples of laterally oriented devices can be found in U.S. Pat. No. 6,600,173 to Tiwari, U.S. Pat. No. 6,222,251 to Holloway and U.S. Pat. No. 6,331,468 to Aronowitz.

Vertically oriented devices extend in a direction that is generally perpendicular to the single major surface of the substrate. The current flow through vertically oriented devices is generally perpendicular to the single major surface of the substrate. Hence, the current flow through a vertically oriented semiconductor device is generally perpendicular to the current flow through a horizontally oriented semiconductor device. Examples of vertically oriented semiconductor device can be found in U.S. Pat. No. 5,106,775 to Kaga, U.S. Pat. No. 6,229,161 to Nemati, U.S. Pat. No. 7,078,739 to Nemati. It should be noted that U.S. Pat. No. 5,554,870 to Fitch, U.S. Pat. No. 6,229,161 to Nemati and U.S. Pat. No. 7,078,739 to Nemati disclose the formation of both horizontal and vertical semiconductor devices on a single major surface of a substrate.

It is desirable to provide computer chips that can operate faster so that they can process more data in a given amount of time. The speed of operation of a computer chip is typically measured in the number of instructions in a given amount of time it can perform. Computer chips can be made to process more data in a given amount of time in several ways. For example, they can be made faster by decreasing the time it takes to perform certain tasks, such as storing and retrieving information to and from the memory chip. The time needed to store and retrieve information to and from the memory chip can be decreased by embedding the memory devices included therein with the computer chip. This can be done by positioning the memory devices on the same surface as the other devices carried by the substrate.

However, there are several problems with doing this. One problem is that the masks used to fabricate the memory devices are generally not compatible with the masks used to fabricate the other devices on the computer chip. Hence, it is more complex and expensive to fabricate a computer chip with memory embedded in this way. Another problem is that memory devices tend to be large and occupy a significant amount of area. Hence, if most of the area on the computer chip is occupied by memory devices, then there is less area for the other devices. Further, the yield of the computer chips fabricated in a run decreases as their area increases, which increases the overall cost.

Instead of embedding the memory devices on the same surface as the other devices, the memory chip can be bonded to the computer chip to form a stack, as in a 3-D package or a 3-D integrated circuit (IC). Conventional 3-D packages and 3-D ICs both include a substrate with a memory circuit bonded to it by a bonding region positioned therebetween. The memory chip typically includes lateral memory devices which are prefabricated before the bonding takes place. In both the 3-D package and 3-D ICs, the memory and computer chips include large bonding pads coupled to their respective circuits. However, in the 3-D package, the bonding pads are connected together using wire bonds so that the memory and computer chips can communicate with each other. In the 3-D IC, the bonding pads are connected together using high pitch conductive interconnects which extend therebetween.

Examples of 3-D ICs are disclosed in U.S. Pat. Nos. 5,087,585, 5,308,782, 5,355,022, 5,915,167, 5,998,808 and 6,943,067.

There are several problems, however, with using 3-D packages and 3-D ICs. One problem is that the use of wire bonds increases the access time between the computer and memory chips because the impedance of wire bonds and large contact pads is high. The contact pads are large in 3-D packages to make it easier to attach the wire bonds thereto. Similarly, the contact pads in 3-D ICs have correspondingly large capacitances which also increase the access time between the processor and memory circuits. The contact pads are large in 3-D ICs to make the alignment between the computer and memory chips easier. These chips need to be properly aligned with each other and the interconnects because the memory devices carried by the memory chip and the electronic devices carried by the computer chip are prefabricated before the bonding takes place.

Another problem with using 3-D packages and 3-D ICs is cost. The use of wire bonds is expensive because it is difficult to attach them between the processor and memory circuits and requires expensive equipment. Further, it requires expensive equipment to align the various devices in the 3-D IC. The bonding and alignment is made even more difficult and expensive because of the trend to scale devices to smaller dimensions. It is also very difficult to fabricate high pitch conductive interconnects.

Some references disclose forming an electronic device, such as a dynamic random access memory (DRAM) capacitor, by crystallizing polycrystalline and/or amorphous semiconductor material using a laser. One such electronic device is described in U.S. patent Application No. 20040131233 to Bhattacharyya. The laser is used to heat the polycrystalline or amorphous semiconductor material to form a single crystalline semiconductor material. However, a disadvantage of this method is that the laser is capable of driving the temperature of the semiconductor material to be greater than 800 degrees Celsius (° C.). In some situations, the temperature of the semiconductor material is driven to be greater than about 1000° C. It should be noted that some of this heat undesirably flows to other regions of the semiconductor structure proximate to the DRAM capacitor, which can cause damage.

Accordingly, it is highly desirable to provide a new method for forming electronic devices using wafer bonding which is cost effective and reliable, and can be done at low temperature.

BRIEF SUMMARY OF THE INVENTION

The invention provides a bonded semiconductor structure, which includes a support substrate which carries a first electronic circuit and an interconnect region carried by the support substrate. The interconnect region includes a capacitor and conductive line in communication with the first electronic circuit. The circuit includes a bonding layer carried by the interconnect region, and a bonded substrate coupled to the interconnect region through the bonding layer.

The bonded semiconductor structure can include many other features. For example, in some embodiments, the bonded semiconductor structure includes a bonding interface, wherein the bonded substrate and interconnect region are coupled together through the bonding interface. The bonding interface is between the capacitor and bonded substrate. The bonding layer is between the capacitor and bonded substrate.

In some embodiments, the bonded semiconductor structure includes a dielectric material region positioned between the conductive line and bonding layer. In some embodiments, the bonded semiconductor structure includes a dielectric material region positioned between the conductive line and a sidewall of the bonded substrate.

In some embodiments, the bonded substrate includes a semiconductor material region positioned between the second electronic circuit and bonding layer. In some embodiments, the bonded substrate includes a semiconductor material region positioned between the second electronic circuit and bonding interface.

In some embodiments, the bonded semiconductor structure includes a second electronic circuit carried by the bonded substrate. The first and second electronic circuits are in communication with each other through the conductive line. In some embodiments, the bonded semiconductor structure includes a second interconnect region carried by the bonded substrate, the second interconnect region being in communication with the second electronic circuit and the conductive line. The bonding layer and second electronic circuit are positioned proximate to a bonding surface and detach layer surface of the bonded substrate, respectively.

The invention provides a bonded semiconductor structure, which includes an interconnect region which includes a capacitor and conductive line, and a bonding layer carried by the interconnect region. The bonded semiconductor structure includes a bonded substrate coupled to the interconnect region through the bonding layer. The interconnect region includes a first dielectric material region between the bonding layer and capacitor.

The bonded semiconductor structure can include many other features. For example, in some embodiments, the bonded substrate includes a detach layer surface positioned away from the bonding layer. In some embodiments, the bonded semiconductor structure includes a second dielectric material region between the bonding layer and conductive line. In some embodiments, the bonded semiconductor structure includes a second dielectric material region between a sidewall of the bonded substrate and the conductive line. In some embodiments, the bonded semiconductor structure includes a support substrate which carries a first electronic circuit, the first electronic circuit being in communication with the capacitor and conductive line. In some embodiments, the bonded semiconductor structure includes a second electronic circuit carried by the bonded substrate, the second electronic circuit being in communication with the first electronic circuit through the conductive line.

The present invention employs a method of forming a bonded semiconductor structure, which includes providing a support substrate which carries a first electronic circuit and providing an interconnect region carried by the support substrate. The interconnect region includes a capacitor and conductive line in communication with the first electronic circuit. The method includes providing a bonding layer carried by the interconnect region and coupling a bonded substrate to the interconnect region through the bonding layer.

The method can include many other steps. For example, in some embodiments, the step of coupling includes forming a bonding interface. In some embodiments, the step of coupling includes forming a metal-semiconductor bonding interface.

In some embodiments, the method includes decoupling the bonded substrate from a carrier substrate. In some of these embodiments, the method includes forming a second electronic circuit proximate to a detach layer surface of the bonded substrate. The method can include a step of providing a second interconnect region which provides communication between the second electronic circuit and conductive line.

These and other features, aspects, and advantages of the present invention will become better understood with reference to the following drawings, description, and claims.

BRIEF DESCRIPTION OF THE DRAWINGS

FIGS. 11a and 11b are flow diagrams of methods, in accordance with the invention, of forming a bonded semiconductor structure.

DETAILED DESCRIPTION OF THE INVENTION

Figure 1:
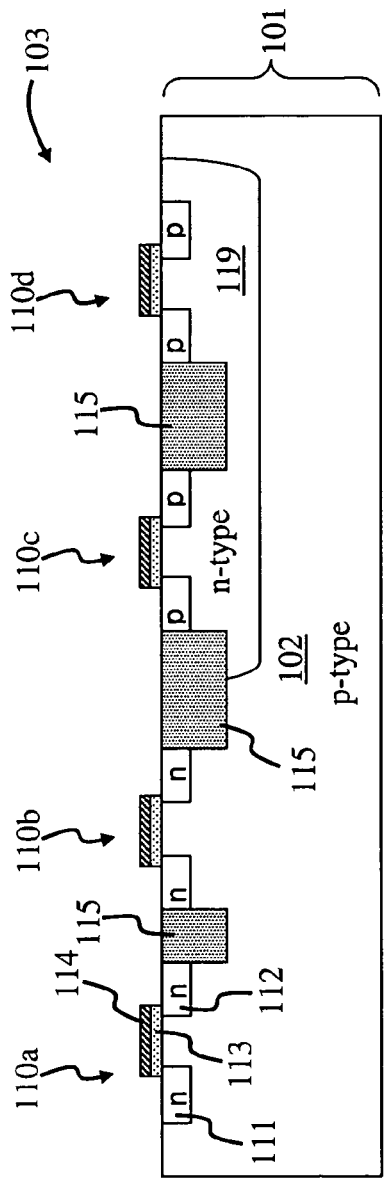
FIGS. 1-12 are sectional views of steps in forming a bonded semiconductor structure, in accordance with the present invention.

FIGS. 1-12 are sectional views of steps in forming a bonded semiconductor structure 100, in accordance with the invention. Bonded semiconductor structure 100 can be included in a computer chip having a memory region carried by a support substrate, wherein the support substrate generally has electronic circuitry formed therewith. The semiconductor material included with bonded semiconductor structure 100 can be of many different types, such as silicon, germanium, silicon-germanium. Further, support substrate 101 typically includes silicon, but it can also a include silicon-on-sapphire (SOS) and silicon-on-insulator (SOI) layer structure. The support substrate is typically a semiconductor substrate, which includes a semiconductor material such as silicon.

In some embodiments, the electronic circuitry formed with the support substrate includes processor and/or control circuitry. The processor circuitry processes data, such as digital data, and the control circuitry controls the flow of the data, such as sending it to and retrieving it from the memory region. The electronic circuitry can include many different types of electronic devices, such as metal-oxide semiconductor field effect transistors (MOSFET). One type of electronic circuitry often used is referred to as complementary MOSFET (CMOS) circuitry.

The memory region can include many different types of memory, such as read only memory (ROM) and/or random access memory. Examples of different types of memory include dynamic random access memory (DRAM), static random access memory (SRAM) and FLASH memory, among others. Examples of electronic circuitry and memory can be found in U.S. Pat. Nos. 4,704,785, 4,829,018, 4,939,568, 5,087,585, 5,093,704, 5,106,775, 5,266,511, 5,308,782, 5,355,022, 5,554,870, 5,627,106, 5,835,396, 5,977,579, 5,998,808, 6,153,495, 6,222,251, 6,331,468, 6,600,173, 6,630,713, 6,677,204, 6,943,067, 6,943,407, 6,995,430, 7,078,739, as well as U.S. patent application Ser. Nos. 20020024140, 20020025604, 20020141233, 20030067043, 20030113963, 20030139011, 20040113207, 20040155301 and 20040160849.

It should be noted that the electronic circuitry, as well as the memory, can include horizontally and/or vertically oriented semiconductor devices. As is well-known, most integrated circuits include laterally oriented active and passive electronic devices that are carried on a single major surface of a substrate. The current flow through laterally oriented devices is generally parallel to the single major surface of the substrate. Active devices typically include transistors and passive devices typically include resistors, capacitors, and inductors. However, these laterally oriented devices consume significant amounts of chip area. Sometimes laterally oriented devices are referred to as planar or horizontal devices. Examples of laterally oriented devices can be found in U.S. Pat. No. 6,600,173 to Tiwari, U.S. Pat. No. 6,222,251 to Holloway and U.S. Pat. No. 6,331,468 to Aronowitz.

Vertically oriented devices extend in a direction that is generally perpendicular to the single major surface of the substrate. The current flow through vertically oriented devices is generally perpendicular to the single major surface of the substrate. Hence, the current flow through a vertically oriented semiconductor device is generally perpendicular to the current flow through a horizontally oriented semiconductor device. Examples of vertically oriented semiconductor device can be found in U.S. Pat. No. 5,106,775 to Kaga, U.S. Pat. No. 6,229,161 to Nemati, U.S. Pat. No. 7,078,739 to Nemati. It should be noted that U.S. Pat. No. 5,554,870 to Fitch, U.S. Pat. No. 6,229,161 to Nemati and U.S. Pat. No. 7,078,739 to Nemati disclose the formation of both horizontal and vertical semiconductor devices on a single major surface of a substrate.

It should also be noted that the memory region is often referred to as memory core, wherein the memory core is generally "embedded memory" or "stand-alone memory". Embedded memory is typically positioned so that it, as well as the circuitry, are carried by the same carrier substrate, wherein the circuitry includes processor and/or control circuitry. More information regarding embedded memory can be found in the above-identified references, such as U.S. patent application Ser. No. 11/092,521, entitled "Electronic Circuit with Embedded Memory". One type of embedded memory is often referred to as cache memory, such as L1 and L2 cache memory, wherein the embedded memory is embedded with a central processing unit (CPU). In another embodiment, the embedded memory is embedded with a microcontroller. Examples of a CPU are disclosed in U.S. Pat. Nos. 5,737,748 and 5,829,026, and examples of a microcontroller are disclosed in U.S. Pat. Nos. 6,009,496 and 6,854,067.

Stand-alone memory is typically positioned so that it and processor circuitry are carried by different carrier substrates. It should be noted, however, that stand-alone memory can include control circuitry carried on the same carrier substrate as the memory region. Stand-alone memory is typically included with a memory module, such as those disclosed in U.S. Pat. Nos. 6,742,067, 6,751,113 and 6,535,411. These types of memory modules are pluggable into a printed circuit board, wherein they are in communication with the processor circuitry through the printed circuit board. A printed circuit board generally includes an insulative substrate and conductive interconnects. The processor circuitry and memory region are included in computer chips which are connected together with the conductive interconnects of the printed circuit board. Examples of printed circuit boards are disclosed in U.S. Pat. Nos. 6,621,168 and 6,787,920.

The memory region is typically connected to the electronic circuitry through an interconnect region which includes a conductive line and/or conductive via. In this way, signals can flow between the electronic circuitry and memory region through the interconnect region. The signals can include many different types of signals, such as data signals and control signals. It should be noted that the conductive lines of interconnect regions 134, 144 and 144 can include the refractory metals discussed above, and they can include other metals, such as aluminum (Al), copper (Cu) titanium (Ti), titanium nitride (TiN), tungsten (W).

It should also be noted that some of the steps of FIGS. 1-12 include growing materials to form a growth interface. A growth interface is an interface that is formed in response to growing a material layer on another material layer. In one example of forming a growth interface, a metal layer is grown on a semiconductor material layer so that a metal-semiconductor growth interface is formed in response. In another example of forming a growth interface, a dielectric material layer is formed on a semiconductor material layer so that a dielectric-semiconductor growth interface is formed in response. The materials can be formed using many different growth techniques, such as sputtering and chemical vapor deposition. Hence, when forming a growth interface, one layer is formed on another layer. When forming a growth interface, the layers are not formed as separate layers, and moved so that they engage each other, as in bonding.

Some of the steps of FIGS. 1-12 include bonding materials together to form a bonding interface. A bonding interface is an interface that is formed in response to bonding material layers together. In one example of forming a bonding interface, first and second material layers are formed as separate layers, and moved towards each other so that they engage each other and the bonding interface is formed in response. It should be noted that heat is generally applied to the first and/or second material layers to facilitate the formation of the bonding interface. Hence, when forming a bonding interface, one layer is not formed on another layer, as in growth. Bonding is useful because there is no known growth method that can be used to epitaxially grow a crystalline semiconductor material layer on a conductive metal layer, such as aluminum, titanium, gold, silver, etc. Hence, bonding can be used if it is desired to have a crystalline semiconductor layer on a conductive metal layer.

More information regarding forming bonding and growth interfaces can be found in U.S. patent application Ser. No. 11/606,523, entitled THREE-DIMENSIONAL INTEGRATED CIRCUIT STRUCTURE, filed on Nov. 30, 2006 by the same inventor, the contents of which are incorporated herein by reference. Other examples of bonding surfaces and bonding interfaces are disclosed in U.S. patent application Ser. No. 11/092,501, entitled "SEMICONDUCTOR BONDING AND LAYER TRANSFER METHOD," filed on Mar. 29, 2005, and is incorporated herein by reference. Information regarding forming bonding and growth interfaces can also be found in U.S. Pat. Nos. 5,152,857, 5,695,557, 5,980,633 and 6,534,382.

In general, bonding and growth interfaces have different types and amounts of defects. For example, dislocations often extend from a growth interface in the direction of material growth. The difference between bonding and growth interfaces can be determined in many different ways, such as by using Transmission Electron Microscopy (TEM) to determine the type and amount of defects at the interface. Information regarding TEM can be found in U.S. Pat. Nos. 5,892,225, 6,531,697, 6,822,233, 7,002,152.

In FIG. 1, partially fabricated bonded semiconductor structure 100 includes a support substrate 101 which carries electronic circuitry 103. Support substrate 101 includes a semiconductor material region 102, which can include many different types of semiconductor material.

In this embodiment, support substrate 101 carries a number of laterally oriented semiconductor devices, which can be included in the processor and/or control circuitry mentioned above. More information regarding support substrate 101 and the semiconductor devices can be found in U.S. patent application Ser. No. 11/092,521.

In this embodiment, the lateral semiconductor devices are embodied as lateral transistors 110a, 110b, 110c and 110d. Transistors 110a, 110b, 110c and 110d can be of many different types, but here they are embodied as metal oxide field effect transistors (MOSFETs) having a source 111 and drain 112. The MOSFET transistor also includes a control insulator 113, which extends between source 111 and drain 112, and a control terminal 114 coupled with control insulator 113. It should be noted that these types of transistors are typically used in CMOS circuitry. In this embodiment, transistors 110a and 110b are NMOS transistors and transistors 110c and 110d are PMOS transistors. Transistors 110c and 110d are PMOS transistors because they are formed with an n-type doped well 119 included with support substrate 101, and transistors 110a and 110b are NMOS transistors because they are formed with a p-type doped region of support substrate 101.

In this embodiment, bonded semiconductor structure 100 includes one or more isolation regions 115. An isolation region is typically positioned between adjacent semiconductor devices formed with support substrate 101. For example, in this embodiment, isolation region 115 is positioned between transistors 110b and 110c. Isolation region 115 can include many different types of materials. For example, it can include semiconductor material that has been heavily damaged, such as by ion implantation. In another embodiment, isolation region 115 includes a dielectric material. In general, isolation region 115 restricts the flow of electrical signals therethrough so that signal interference between adjacent electronic devices is reduced. For example, isolation region 115 is positioned to reduce signal interference between transistors 110b and 110c.

Figure 2:
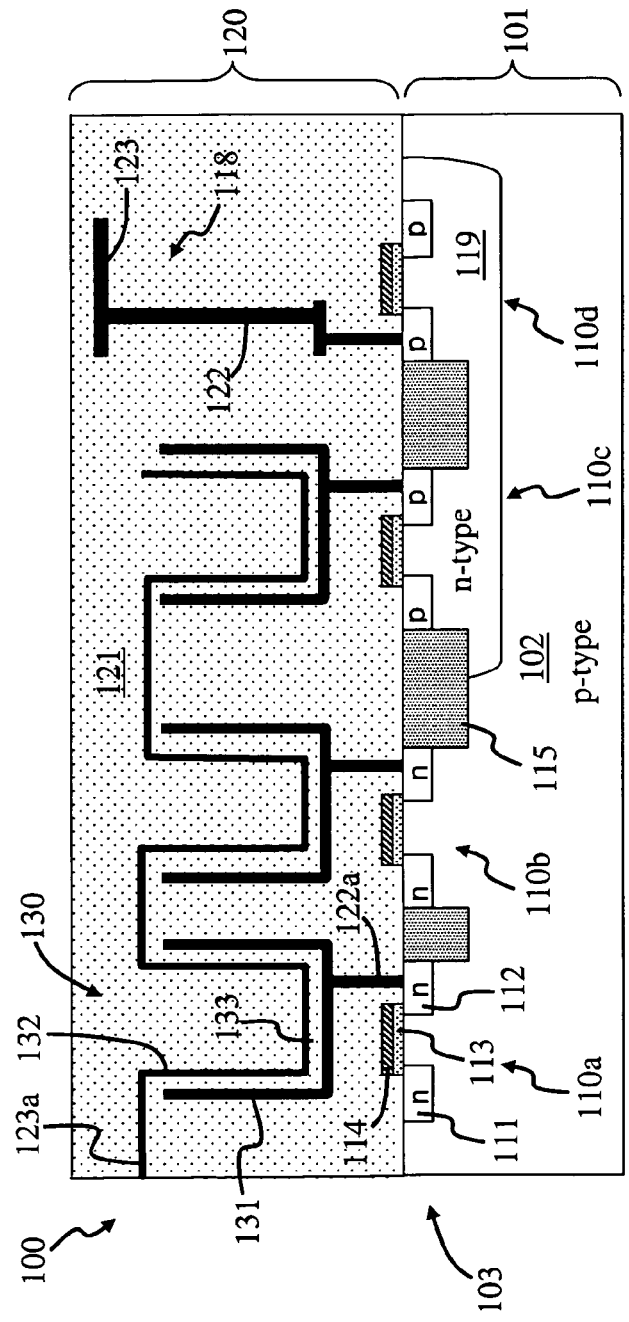

In FIG. 2, an interconnect region 120 is provided so that it is carried by support substrate 101. In this embodiment, interconnect region 120 includes a dielectric material region 121 with one or more conductive lines extending therethrough. In this embodiment, interconnect region 120 includes a conductive line 118 connected to device 110d. In general, a conductive line includes a via and/or an interconnect. In some embodiments, the conductive line includes a via connected to an interconnect. For example, in this embodiment, conductive line 118 includes a via 122 and interconnect 123. A via extends away from support substrate 101 and an interconnect extends along support substrate 101. Dielectric material region 120 can include many different types of dielectric materials, such as silicon oxide and silicon nitride. Dielectric material region 121 can be formed using many different methods, such as CVD (Chemical Vapor Deposition) and SOG (Spin On Glass).

In some embodiments, one or more of the conductive lines of interconnect region 120 includes a refractory metal. For example, conductive line 118 can include the refractory metal. There are many different types of refractory metals that can be included with interconnect region 100. Examples of refractory metals include tungsten (W), titanium (Ti), molybdenum (Mo), tantalum (Ta), titanium nitride (TiN), tantalum nitride (TaN), zirconium nitride (ZrN), tungsten nitride (TN) and alloys thereof. The refractory metals have a low electrical resistivity, low stress, good step coverage and good coefficient of thermal expansion, and can be very stable after following high temperature processes so that superior performance can be maintained.

The refractory metal of interconnect region 120 is useful because in subsequent processing steps, interconnect region 120 is exposed to temperatures in a range from about 800° C. to 1000° C. It is believed that the refractory metal of interconnect region 120 will not substantially degrade when exposed to temperatures in the range from about 800° C. to 1000° C.

In this embodiment, interconnect region 120 includes one or more capacitors. The capacitor(s) can be of many different types, such as a vertically oriented capacitor. Examples of vertically oriented capacitors are provided in U.S. Pat. No. 7,052,941. Another type of capacitor that can be included with interconnect region 120 is disclosed in U.S. Patent Application No. 20020024140.

In this embodiment, interconnect region 120 includes a stack type capacitor 130 which includes electrodes 131 and 132 spaced apart from each other by a capacitor dielectric 133. It should be noted that the material of capacitor dielectric 133 can be the same material or different material from the material included with dielectric material region 120. In this embodiment, capacitor 130 is connected to device 110a through a via 122a, wherein via 122a extends through dielectric material region 120. In this way, capacitor 130 is in communication with a lateral device carried by support substrate 101. In this particular embodiment, via 122a is connected to source 111 of lateral device 110a and to electrode 131 of capacitor 130. Capacitor 130 is also connected to an interconnect 123a, which extends through dielectric material region 120. Interconnect 123a is connected to another portion of electronic circuitry 103, but this is not shown here for simplicity and ease of discussion. In this way, electronic circuitry 103 controls the operation of capacitor 130 by flowing signals through via 122a and interconnect 123a.

Electrodes 131 and 132 can include many different types of conductive materials, such as doped poly silicon and metallic materials, such as the refractory metals mentioned above. Capacitor dielectric 133 can include many different types of insulative materials, such as tantalum oxide ($Ta_2O_5$) or aluminum oxide ($Al_2O_3$), or a stacked film of tantalum oxide/titanium oxide or aluminum oxide/titanium oxide.

In this way, capacitor 130 is a metal-insulator-metal capacitor. In other embodiments, capacitor 130 can be a polysilicon-insulator-polysilicon capacitor and a polysilicon-insulator-metal capacitor. In this embodiment, transistor 110a and capacitor 130 operate as a DRAM memory cell.

Figure 3:
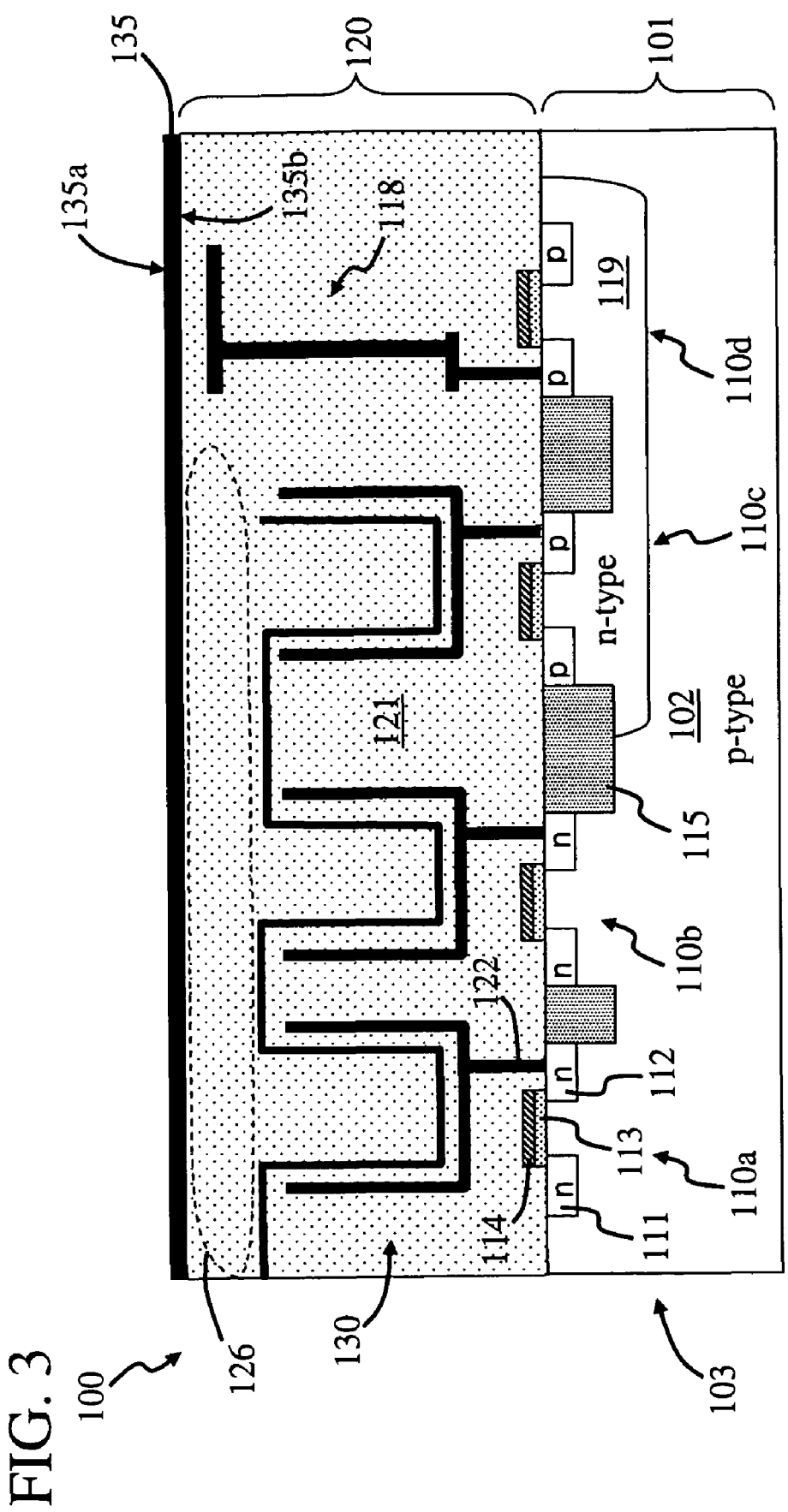

In FIG. 3, a bonding layer 135 is positioned on interconnect region 120. In particular, bonding layer 135 is positioned on dielectric material region 120. Bonding layer 135 is positioned so that it is spaced from support substrate 101 by interconnect region 120. Bonding layer 135 can include one or more material layers. However, bonding layer 135 is shown here as including one layer for simplicity. Bonding layer 135 can include many different types of bonding materials, such as titanium, aluminum, tantalum and alloys thereof. Bonding layer 135 can include a photo-setting adhesive such as reaction-setting adhesive, thermal-setting adhesive, photo-setting adhesive such as UV-setting adhesive, or anaerobe adhesive. Further, the bonding layer include epoxy, acrylate, or silicon adhesives.

Bonding layer 135 can be positioned on interconnect region 100 in many different ways. Bonding layer 135 is typically grown on interconnect region 120 so that bonding layer 135 has a surface 135b positioned towards dielectric material region 120 and a surface 135a positioned away from dielectric material region 120. It should be noted that the interface between bonding layer 135 and dielectric material region 120 is a growth interface because, as mentioned above, bonding layer 135 is grown on dielectric material region 120. When bonding layer 135 includes a metal, the growth interface is a metal-to-dielectric growth interface.

It should also be noted that interconnect region 120 includes a dielectric material region 126 positioned between bonding layer 135 and capacitor 130. In this embodiment, dielectric material region 126 includes a portion of dielectric material region 120. Dielectric material region 126 provides electrical isolation between capacitor 130 and bonding layer 135.

Figure 4:
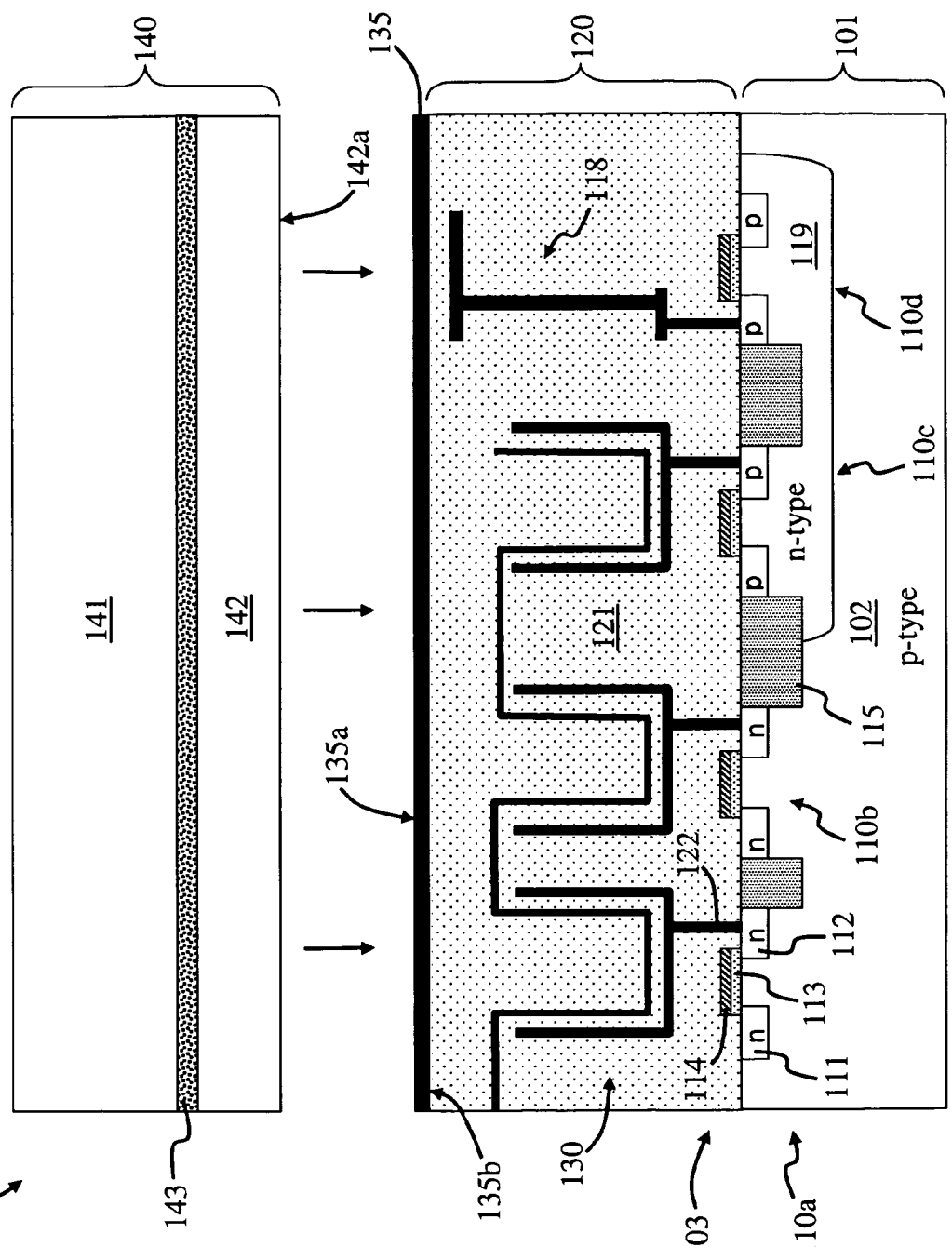

In FIG. 4, a donor structure 140 is provided. In this embodiment, donor structure 140 includes a donor substrate 141 which carries a detach layer 143 and donor layer 142. More information regarding donor structure 140 and detach layer 143 can be found in the above-identified U.S. patent and patent applications, such as U.S. patent application Ser. No. 11/092,501. Detach layer 143 extends between donor layer 142 and substrate 130 so that donor layer 142 can be separated from donor substrate 141, as will be discussed in more detail below.

Detach layer 143 can include many different types of materials, such as a porous material and dielectric material. An example of porous material is porous semiconductor material, such as porous silicon, and examples of a dielectric material include silicon oxide and silicon nitride. Using detach layer 143 is useful because it does not require the use of ion implantation, such as when using exfoliating implants, as disclosed in U.S. Pat. No. 6,600,173. Exfoliating implants cause severe damage in response to the heavy dosage required, and it is necessary to reduce the damage with a high temperature anneal. However, the high temperature anneal can damage the components of bonded semiconductor structure 100, such as the conductive lines and vias of interconnect region 100. Further, the high temperature anneal can degrade the performance of the electronic devices included with bonded semiconductor structure 100, such as transistors 110a, 110b, 110c and 110d.

It should be noted that donor layer 142 can include many different types of materials, but it generally includes a semiconductor material. The semiconductor material can be of many different types, such as silicon. The semiconductor material is typically crystalline semiconductor material and is formed to have desirable electrical properties. Single crystalline semiconductor material can have localized defects, but it is generally of better material quality than amorphous or polycrystalline semiconductor material. Further, donor layer 142 can include one or more semiconductor layers, but here it is shown as including a single semiconductor layer for simplicity.

In one embodiment, donor layer 142 of FIG. 4 consists essentially of crystalline semiconductor material. In another embodiment, donor layer 142 of FIG. 4 consists of crystalline semiconductor material. It should be noted that in these embodiments, donor layer 142 can include defects, such as impurities, as well as dopants to provide it with a desired conductivity type.

It should also be noted that donor layer 142 is typically doped so that it has a desired doping concentration. In some embodiments, donor layer 142 is doped so that its doping concentration is uniform between a surface 142a and detach layer 132, wherein donor layer 142 extends between surface 142a and detach layer 143. In another embodiment, donor layer 142 is doped so that its doping concentration is non-uniform between surface 142a and detach layer 143. In these embodiments, the doping concentration of donor layer 142 can be less proximate to surface 142a and more proximate to detach layer 143. Further, in these embodiments, the doping concentration of donor layer 142 can be more proximate to surface 142a and less proximate to detach layer 143, as discussed in more detail in U.S. patent application Ser. No. 12/040,642.

It should be noted that donor layer 142, as shown in FIG. 4, does not include any electronic devices before it is coupled to support substrate 101, as will be discussed in more detail below. For example, in FIG. 4, donor layer 142 does not include a horizontal transistor and donor layer 142 does not include a vertical transistor. In this way, donor layer 142 consists essentially of a semiconductor material before it is coupled to support substrate 101. In some embodiments, donor layer 142 consists of a semiconductor material before it is coupled to support substrate 101.

Figure 5:
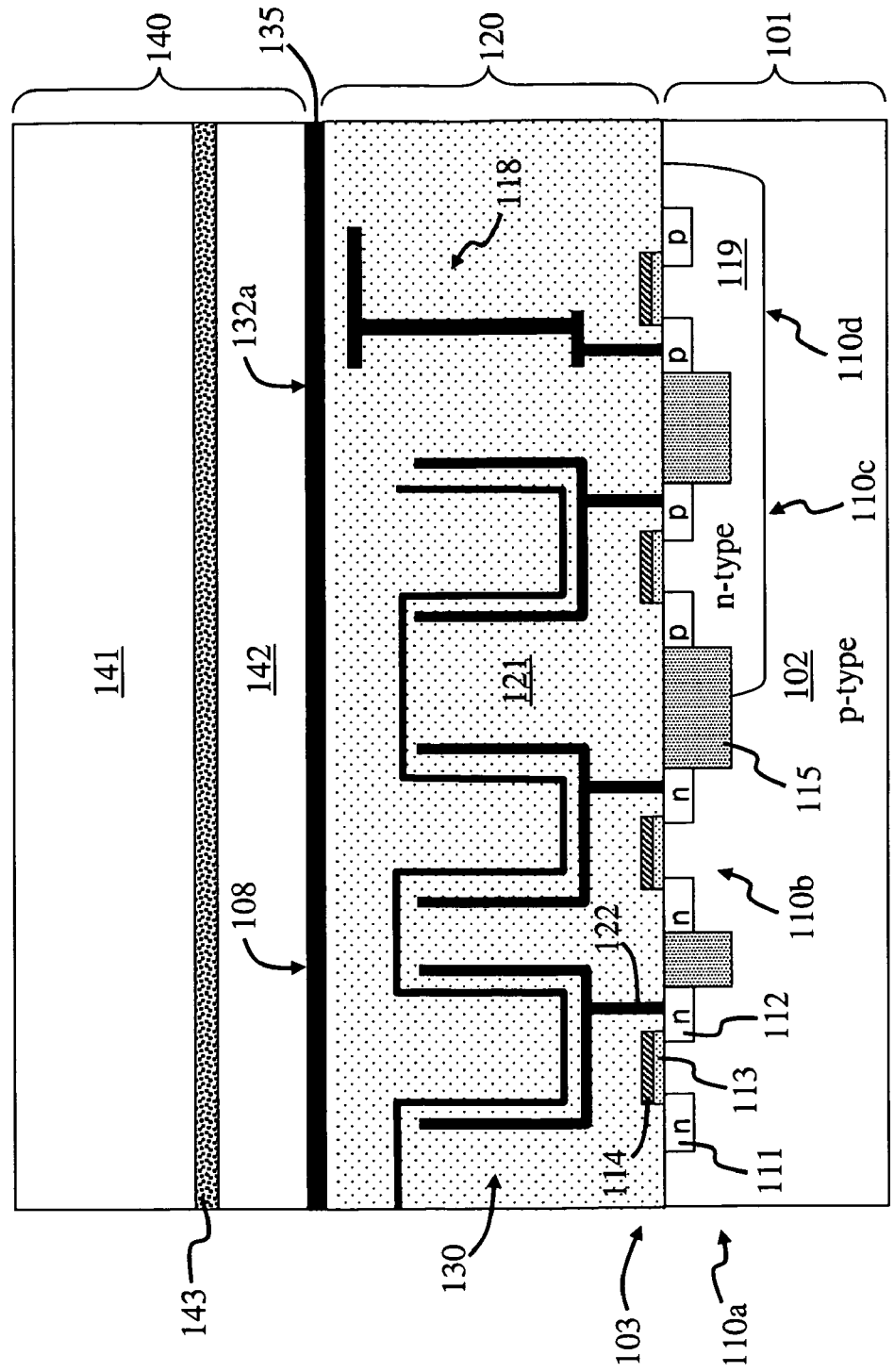

In FIG. 5, donor structure 140 is included with bonded semiconductor structure 100 by coupling it to support substrate 101. Donor structure 140 can be coupled to support substrate 101 in many different ways, such as by using bonding. In this embodiment, donor structure 140 is coupled to support substrate 101 by bonding donor layer 142 to bonding layer 135. In particular, a surface 142a of donor layer 142 is bonded to a surface 135a of bonding layer 135 to form a bonding interface 108 (FIG. 5). In this way, donor structure 140 is coupled to support substrate 101 through a bonding interface and interconnect region 100. Further, donor layer 142 is coupled to support substrate 101 through a bonding interface and interconnect region 100.

It should be noted that donor structure 140 can be bonded to bonding layer 135 without using alignment marks, which are typically used to align one substrate with another when both substrates include electronic devices. Aligning the electronic devices of one substrate with the electronic devices of another substrate a complicated, time-consuming and expensive process, so it is desirable to avoid it. As mentioned above, donor layer 142 does not include electronic devices when bonding interface is formed, so the alignment process is less complicated, less time-consuming and less expensive.

It should also be noted that bonding interface 108 is a semiconductor-to-metal bonding interface when bonding layer 135 includes a metal material and donor layer 142 includes a semiconductor material. More information about bonding can be found in the above-identified related applications.

Bonding interface 108 is typically formed by providing heat to donor layer 142 and/or bonding layer 135, as discussed in more detail in the above above-identified related applications. The heat is provided to donor layer 142 and/or bonding layer 135 by driving their temperature to be between about 350° C. to about 600° C., although temperatures outside of this range can be used. For example, in some embodiments, the heat is provided to donor layer 142 and/or bonding layer 135 by driving their temperature to be between about 300° C. to about 500° C. In one particular example, the heat is provided to donor layer 142 and/or bonding layer 135 by driving their temperature to be between about 375° C. to about 425° C.

In accordance with the invention, the heat provided to donor layer 142 and/or bonding layer 135 is not provided to an electronic device included with donor layer 142 because, as discussed in more detail above, donor layer 142 does not include an electronic device before it is bonded to bonding layer 135. This is useful because the heat provided to donor layer 142 and/or bonding layer 135 can damage an electronic device included with donor layer 142.

In one embodiment, donor layer 142 does not include any electronic devices before it is coupled to support substrate 101 through interconnect region 100 and before bonding interface 108 is formed. In some embodiments, donor layer 142 consists essentially of a semiconductor material before it is coupled to support substrate 101 and before bonding interface 108 is formed. In some embodiments, donor layer 142 consists of a semiconductor material before it is coupled to support substrate 101 and before bonding interface 108 is formed.

Figure 6:
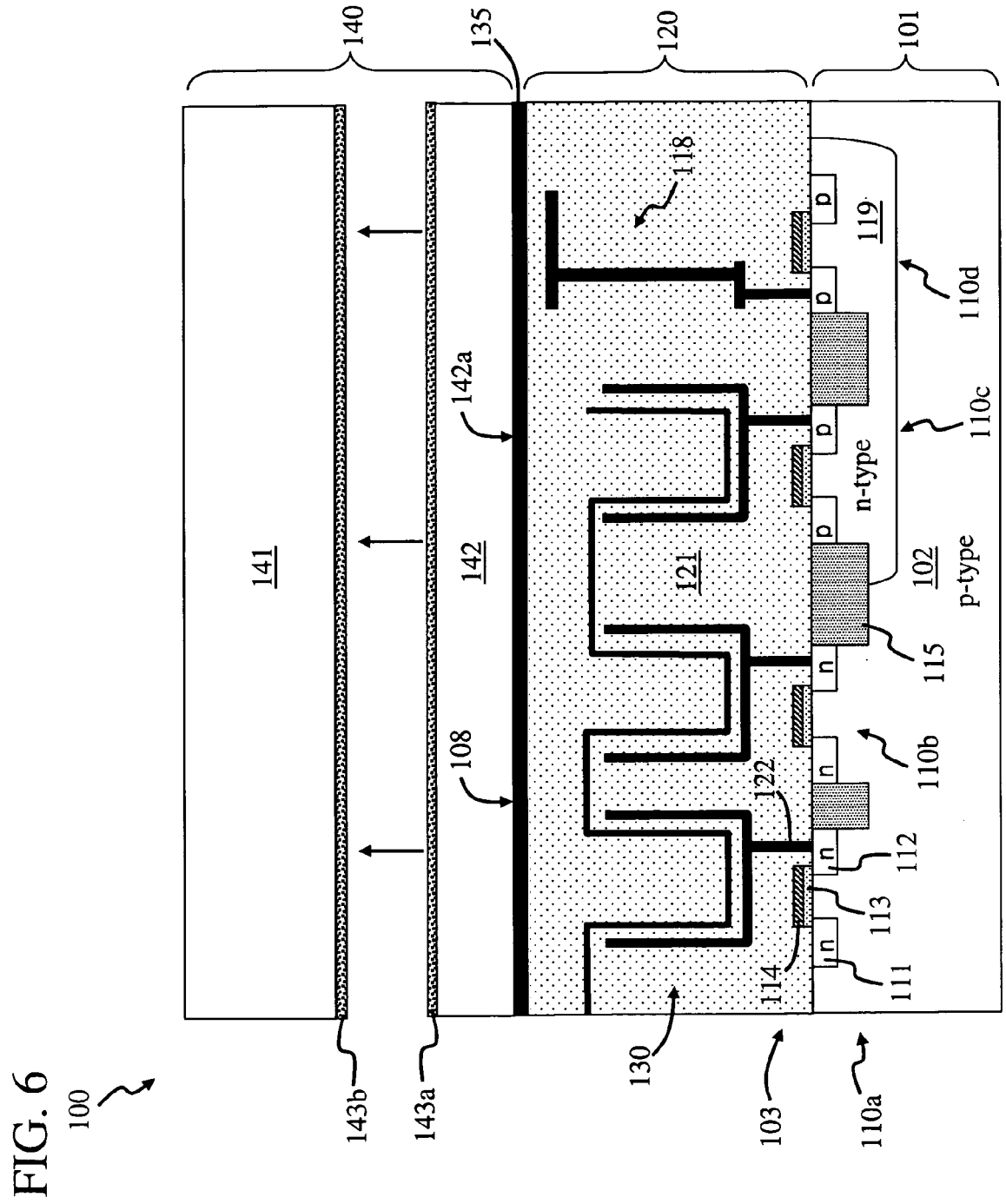

In FIG. 6, donor substrate 141 is decoupled from support substrate 101. Donor substrate 141 can be decoupled from support substrate 101 in many different ways. In this embodiment, donor substrate 141 is decoupled from support substrate 101 by detaching donor substrate 141 from detach layer 143. Donor substrate 141 can be detached from detach layer 143 in many different ways, such as by etching detach layer 143 or by applying a mechanical force to it. More information regarding how to detach donor substrate 141 from detach layer 143 is provided in the above-identified related applications.

Figure 7:
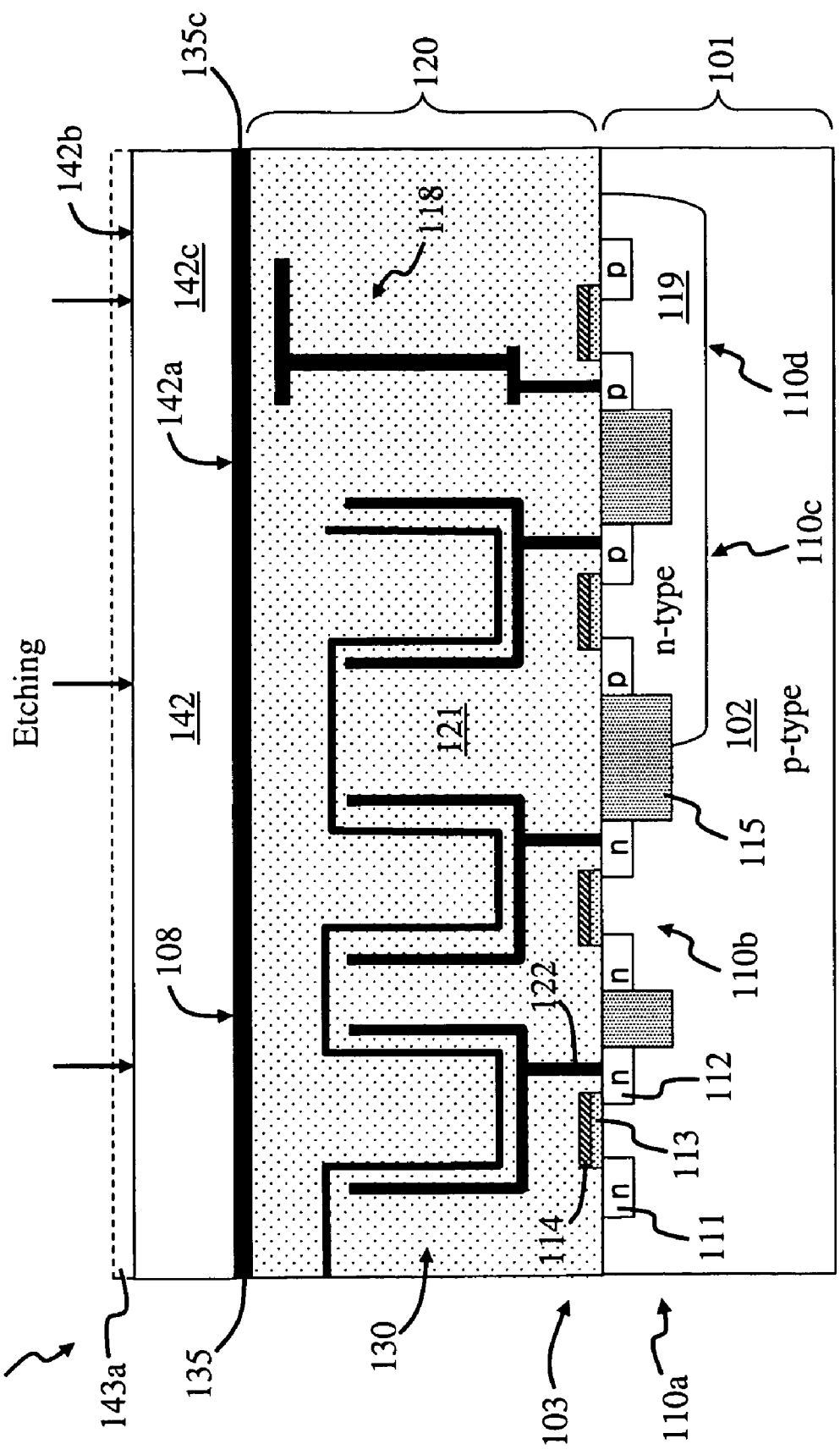

It should be noted that detach layer 143 is typically removed from donor layer 142 when donor substrate 141 is decoupled from support substrate 101. For example, in some situations, portions 143a and 143b are carried by donor layer 142 and donor substrate 141, respectively, in response to decoupling donor substrate 141 from support substrate 101. A surface 142b of donor layer 142 can be exposed, as shown in FIG. 7, in response to removing detach layer 143a from donor layer 142. Surface 142b is spaced from bonding interface 108 by donor layer 142 and surface 142a is positioned towards bonding layer 135. In some embodiments, surface 142b is processed after donor substrate 141 is decoupled from support substrate 101. Surface 142b can be processed in many different ways, such as by etching surface 142b to remove the material of detach layer 143 therefrom. Surface 142b can also be processed to remove defects and/or contaminants therefrom. Surface 142b can also be etched to make it more planar. Surface 142b can be etched in many different ways, such as by using wet and dry etching. Wet etching involves using chemicals and dry etching involves using grinding and polishing, such as chemical mechanical polishing.

Figure 8:
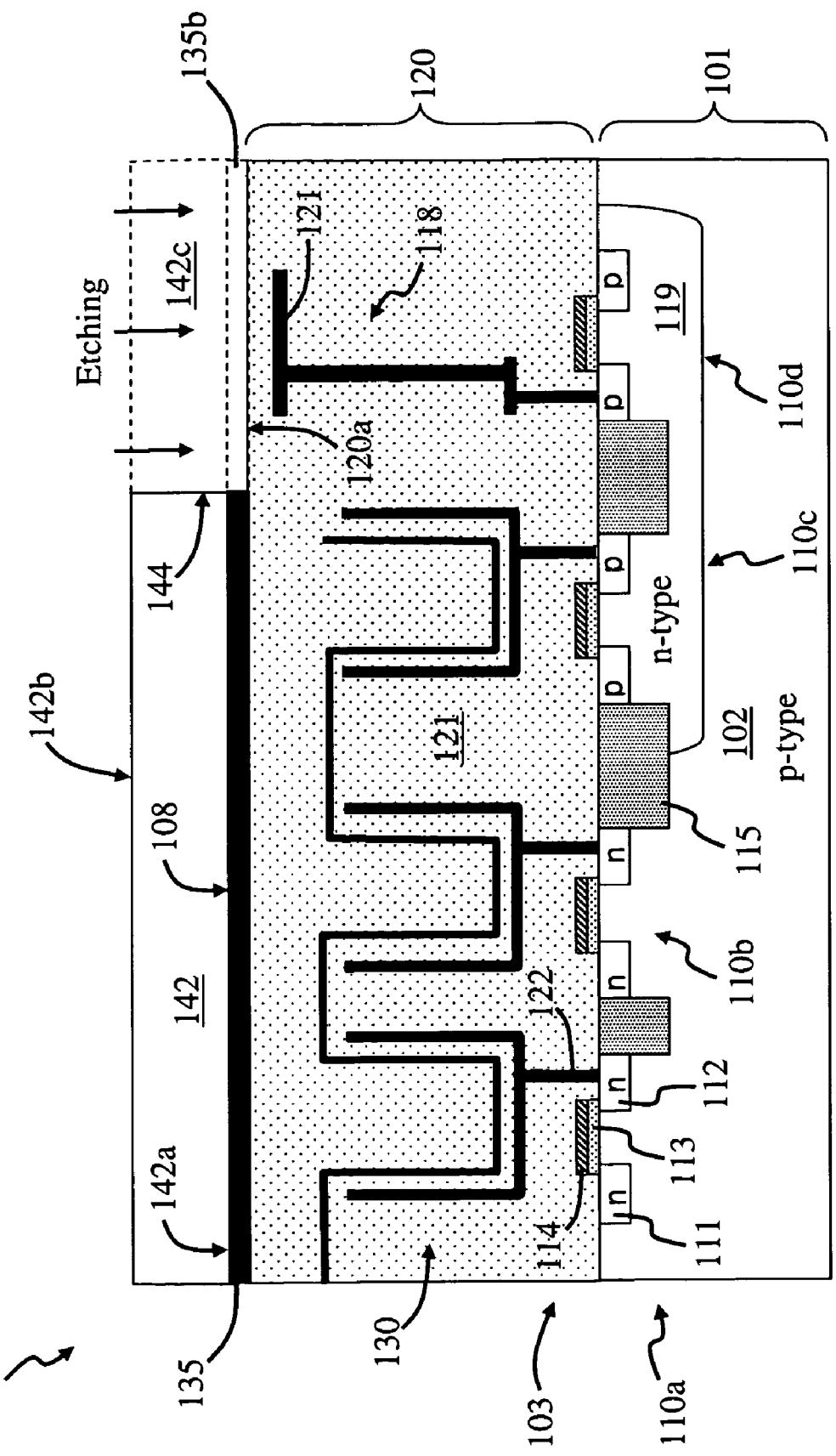

In FIG. 8, portion 142c of donor layer 142 and portion 135b of bonding layer 135 are removed from donor layer 142 and bonding layer 135, respectively, to expose a surface 120a of interconnect region 120. It should be noted that a sidewall 144 is formed in response to etching through donor layer 142. In this embodiment, sidewall 144 extends upwardly from bonding layer 135. It should also be noted that, in this embodiment, portions 142c and 135b are proximate to conductive line 118 so that connection can be made to interconnect 121 of conductive line 118, as will be discussed in more detail below.

Figure 9:
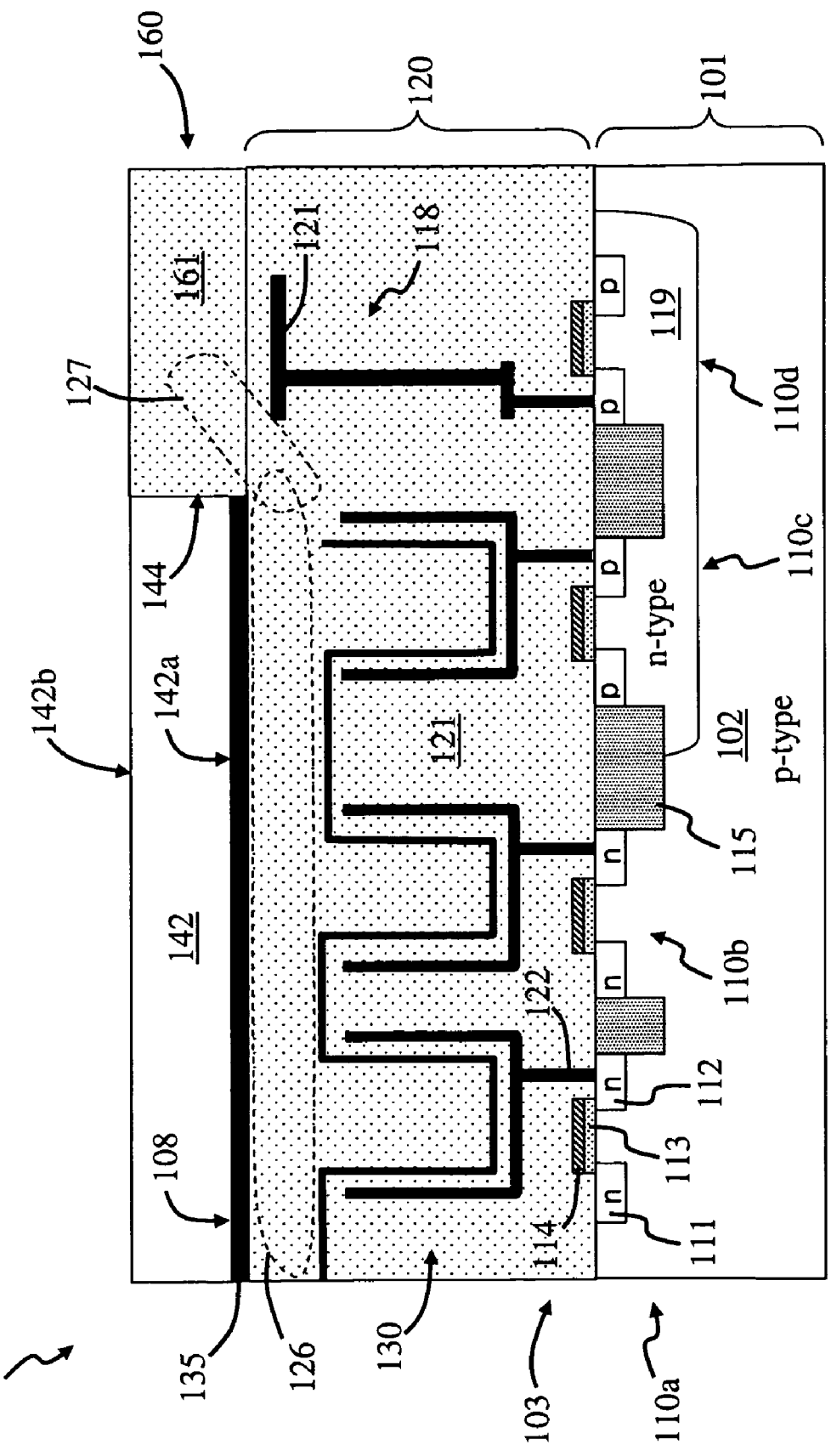

In FIG. 9, an interconnect region 160 is formed proximate to surface 120a and sidewall 144. In this embodiment, interconnect region 160 includes a dielectric material region 161 positioned so it extends upwardly from surface 120a and along sidewall 144. Dielectric material region 161 can include many different insulative materials, such as those discussed in more detail above. The insulative included in dielectric material region 161 is typically the same insulative material included in dielectric material region 121. As discussed in more detail below, interconnect region 160 includes one or more conductive lines which provide a connection to electronic circuitry 103.

It should be noted that bonded semiconductor structure 100 includes a dielectric material region 127 which extends between donor layer 142 and conductive line 118. In this embodiment, dielectric material region 127 extends between bonding interface 108 and conductive line 118. Further, dielectric material region 127 extends between bonding layer 135 and conductive line 118. Dielectric material region 127 extends between sidewall 144 and conductive line 118.

Dielectric material region 127 can include a portion of interconnect region 104. Dielectric material region 127 can include a portion of dielectric material region 120. In particular, dielectric material region 127 can include a portion of dielectric material region 126. In this particular embodiment, dielectric material region 127 includes portions of dielectric material region 120, dielectric material region 126 and dielectric material region 161.

Figure 10:
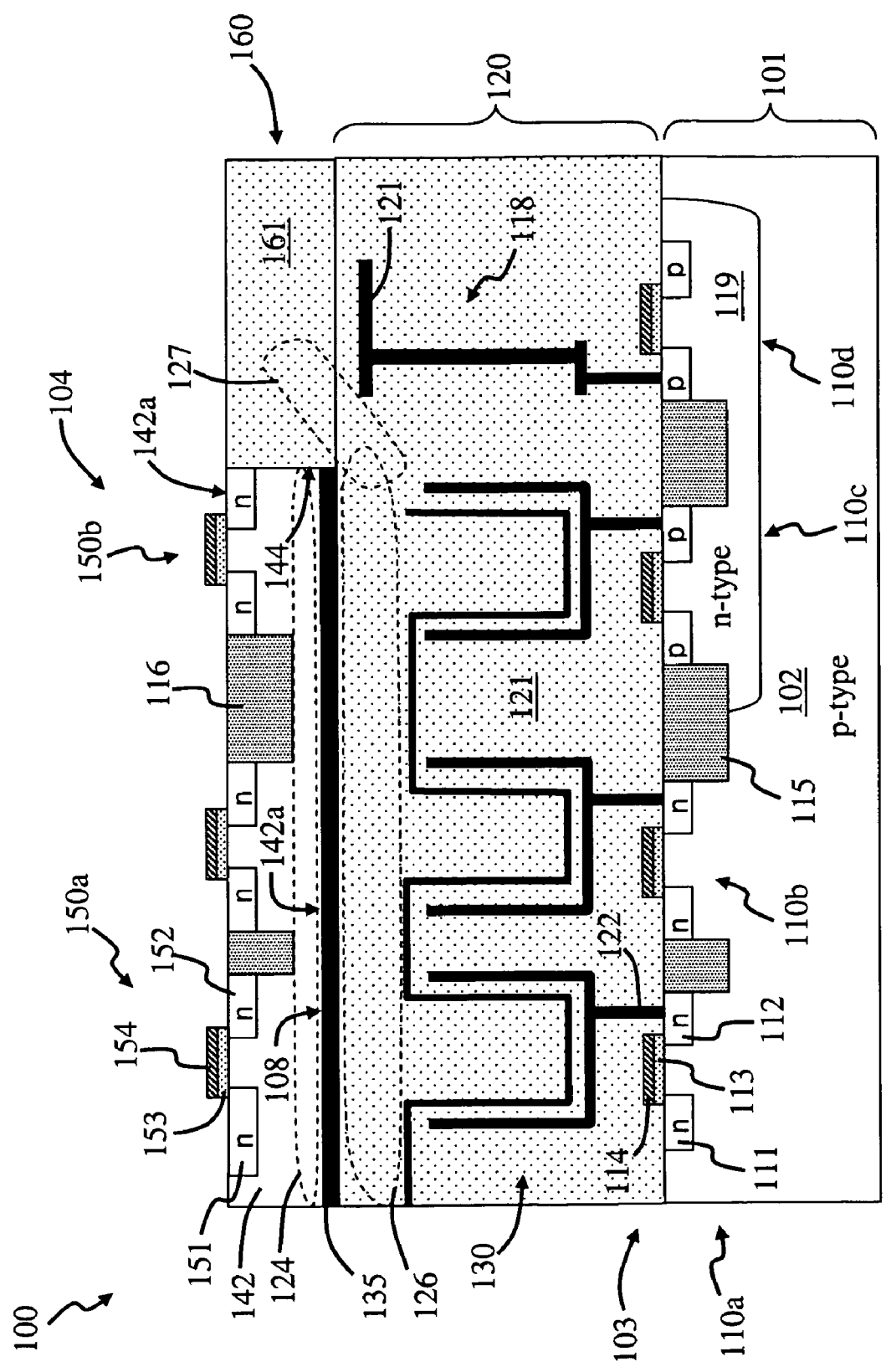

In FIG. 10, electronic circuitry 104 is formed so that it is carried by donor layer 142. In particular, electronic circuitry 104 is formed proximate to surface 135a. Electronic circuitry 104 can include many different types of device, such as those mentioned above. In this embodiment, electronic circuitry 104 includes laterally oriented semiconductor devices, such as lateral transistors 150a and 150b. In this embodiment, lateral transistors 150a and 150b are the same or similar to lateral transistors 110a, 100b, 110c and 110d, which operate as a MOSFET. Lateral transistors 150a and 150b each include a source 151 and drain 152, as well as a control insulator 153, which extends between source 151 and drain 152, and a control terminal 154 coupled with control insulator 153. It should be noted that these types of transistors are typically used in CMOS circuitry.

It should be noted that electronic circuitry 104 can include the same type of circuitry included with electronic circuitry 103. For example, electronic circuitry 104 can include CMOS circuitry having NMOS and PMOS devices. Further, electronic circuitry 104 can include one or more isolation regions, such as isolation region 116, wherein isolation region 116 is the same or similar to isolation region 115.

It should be noted that donor substrate 142 includes a semiconductor material region 124 positioned between electronic circuitry 104 and bonding layer 135. In particular, semiconductor material region 124 extends between electronic circuitry 104 and bonding layer 135 to provide electrical isolation therebetween. Semiconductor material region 124 is positioned between and extends between electronic circuitry 104 and bonding interface 108. Further, semiconductor material region 124 is positioned between and extends between electronic circuitry 104 and interconnect region 104.

It should also be noted that dielectric material region 127 is positioned between and extends between conductive line 118 and electronic circuitry 104. Further, dielectric material region 127 is positioned between and extends between conductive line 118 and semiconductor material region 124.

In accordance with the invention, electronic circuitry 104 is formed after bonding interface 108 is formed. Forming electronic circuitry 104 after bonding interface 108 is formed is useful so that they are not exposed to the heat used to form bonding interface 108. As mentioned above, the heat used to form bonding interface 108 can damage any electronic devices included with donor layer 142. It should be noted that electronic circuitry 104 is typically formed with donor layer 142 using semiconductor device processing techniques that are well-known. These semiconductor device processing techniques generally involve doping, photolithography, masking and etching. The dopants are typically introduced using diffusion doping and ion implantation. These processing steps are typically done at a lower temperature to reduce the likelihood of electronic circuitry 103 being damaged. It should be noted that interconnect region 120 operates as a thermal barrier to heat flowing between electronic circuitry 103 and 104. The heat can be from many different sources, such as heat from the formation if electronic circuitry 104. The heat can also be from the operation of electric circuitry 104.

Figure 11:
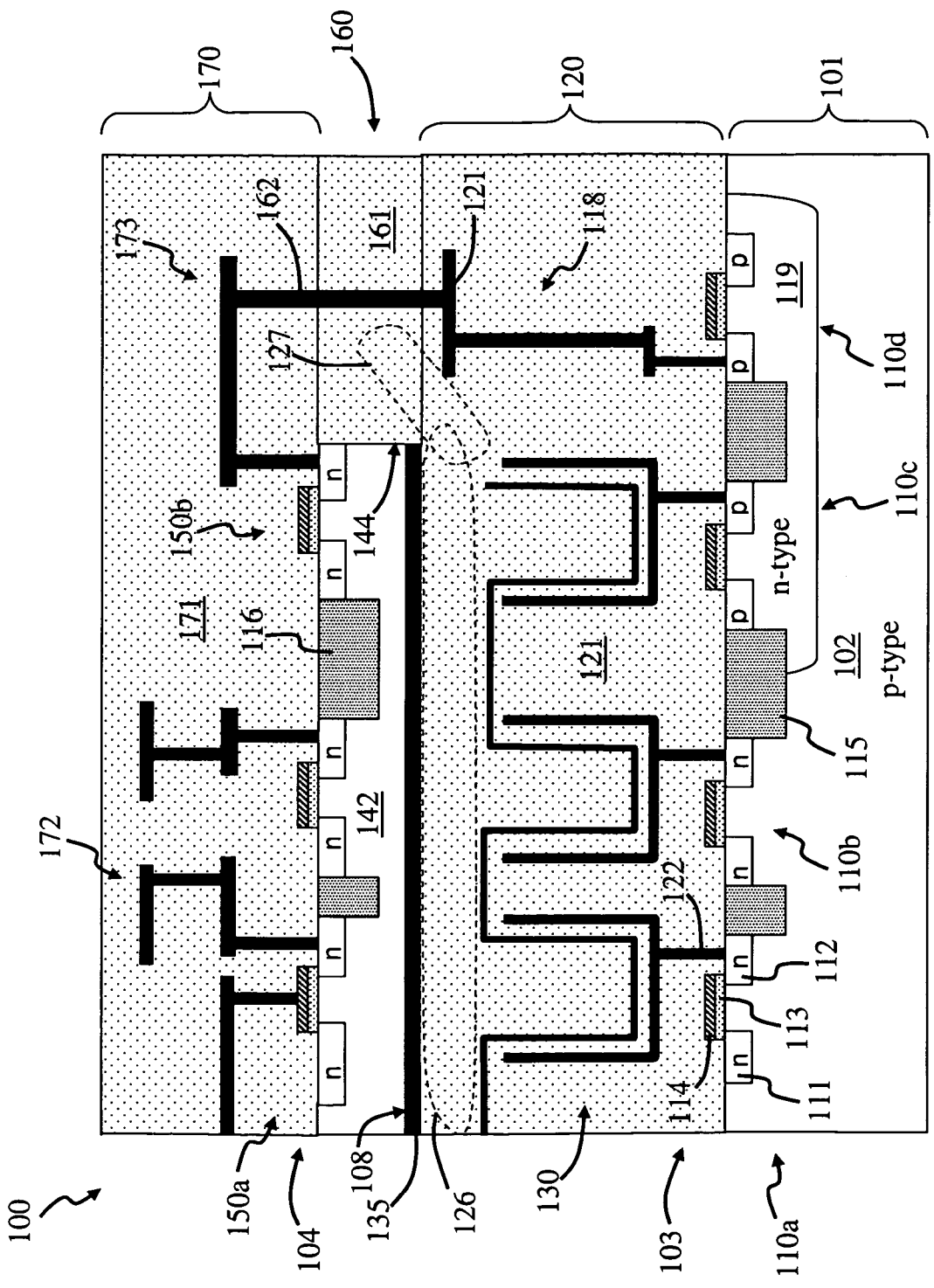
Figure 12:
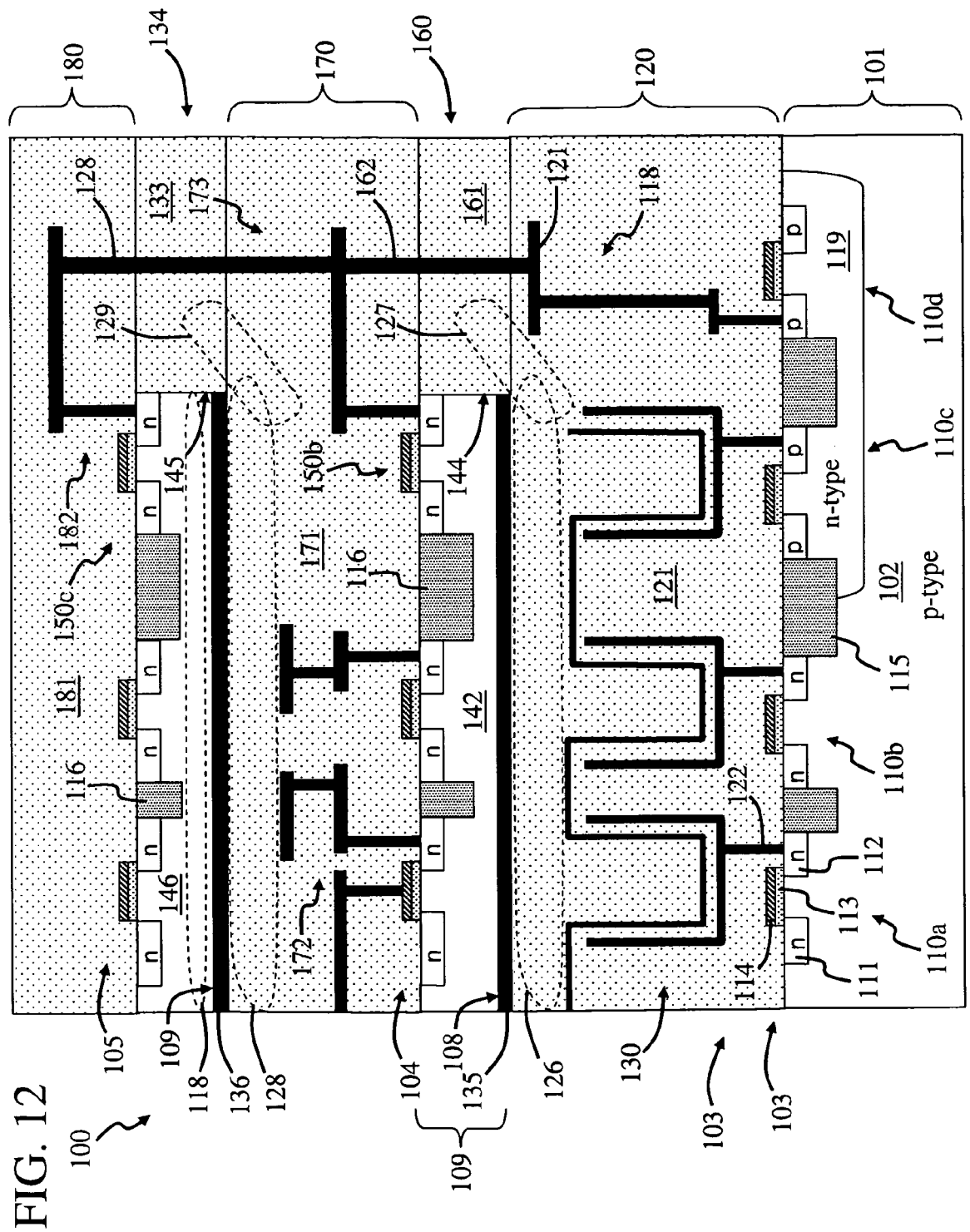

In FIG. 11, an interconnect region 170 is provided so that it is carried by donor layer 142. In this embodiment, interconnect region 170 includes a dielectric material region 171 with one or more conductive lines extending therethrough. In this embodiment, interconnect region 170 includes a conductive line 172 connected to electronic device 150a. Further, interconnect region 170 includes a conductive line 173 connected to electronic device 150b, and electronic device 110a through interconnect regions 120 and 160. Interconnect region 160 includes a via 162 which extends between interconnect 121 of conductive line 118 and conductive line 173 of interconnect region 170.

It should be noted that, in some embodiments, bonded semiconductor structure 100 includes more than one donor layer 142 with corresponding electronic circuitry. For example, in FIG. 12, bonded semiconductor structure 100 includes a donor layer 146 bonded to interconnect region 170 with a bonding layer 136. Bonding layer 136 can include the same material as bonding layer 135, and can be formed in the same or a similar manner. Electronic circuitry 105 is carried by donor layer 146. Donor layer 146 and electronic circuitry 105 can be formed in the same or a similar manner as donor layer 142. Interconnect region 170 can be formed in the same or a similar manner as interconnect regions 120, 160 and 170. In this embodiment, interconnect region 170 includes a conductive line 182 which connects an electronic device 150c of electronic circuitry 105 with conductive line 173 of interconnect region 170. In this way, electronic device 150c is connected to via 162 of interconnect region 160, and electronic device 110d of electronic circuitry 103. It should be noted that electronic device 150c can be the same or similar to the other electronic devices discussed herein.

It should also be noted that donor substrate 146 includes a semiconductor material region 125 positioned between electronic circuitry 105 and bonding layer 136. In particular, semiconductor material region 125 extends between electronic circuitry 105 and bonding layer 136 to provide electrical isolation therebetween. Semiconductor material region 125 is positioned between and extends between electronic circuitry 105 and bonding interface 109. Further, semiconductor material region 125 is positioned between and extends between electronic circuitry 105 and interconnect region 170.

In some embodiments, semiconductor material region 125 includes semiconductor material. In some embodiments, semiconductor material region 125 consists of semiconductor material. In some embodiments, semiconductor material region 125 consists essentially of semiconductor material.

While particular embodiments of the invention have been shown and described, numerous variations and alternate embodiments will occur to those skilled in the art. Accordingly, it is intended that the invention be limited only in terms of the appended claims.

The invention claimed is:

1. A bonded semiconductor structure, comprising:
a support substrate which carries a first electronic circuit;
an interconnect region carried by the support substrate, the interconnect region including a capacitor and conductive line in communication with the first electronic circuit;
a bonding layer carried by the interconnect region; and
a bonded substrate coupled to the interconnect region through the bonding layer.

2. The structure of claim 1, further including a bonding interface, wherein the bonded substrate and interconnect region are coupled together through the bonding interface.

3. The structure of claim 2, wherein the bonding interface is between the capacitor and bonded substrate.

4. The structure of claim 1, wherein the bonding layer is between the capacitor and bonded substrate.

5. The structure of claim 1, further including a dielectric material region positioned between the conductive line and bonding layer.

6. The structure of claim 1, further including a dielectric material region positioned between the conductive line and a sidewall of the bonded substrate.

7. The structure of claim 1, wherein the bonded substrate includes a semiconductor material region positioned between the second electronic circuit and bonding layer.

8. The structure of claim 1, wherein the bonded substrate includes a semiconductor material region positioned between the second electronic circuit and bonding interface.

9. The structure of claim 1, further including a second electronic circuit carried by the bonded substrate.

10. The structure of claim 9, wherein the first and second electronic circuits are in communication with each other through the conductive line.

11. The structure of claim 9, further including a second interconnect region carried by the bonded substrate, the second interconnect region being in communication with the second electronic circuit and the conductive line.

12. The structure of claim 9, wherein the bonding layer and second electronic circuit are positioned proximate to a bonding surface and detach layer surface of the bonded substrate, respectively.

13. A bonded semiconductor structure, comprising:
   an interconnect region which includes a capacitor and conductive line;
   a bonding layer carried by the interconnect region; and
   a bonded substrate coupled to the interconnect region through the bonding layer;
   wherein the interconnect region includes a first dielectric material region between the bonding layer and capacitor.

14. The structure of claim 13, wherein the bonded substrate includes a detach layer surface positioned away from the bonding layer.

15. The structure of claim 13, further including a second dielectric material region between the bonding layer and conductive line.

16. The structure of claim 13, further including a second dielectric material region between a sidewall of the bonded substrate and the conductive line.

17. The structure of claim 13, further including a support substrate which carries a first electronic circuit, the first electronic circuit being in communication with the capacitor and conductive line.

18. The structure of claim 17, further including a second electronic circuit carried by the bonded substrate, the second electronic circuit being in communication with the first electronic circuit through the conductive line.

19. A method of forming a bonded semiconductor structure, comprising:
   providing a support substrate which carries a first electronic circuit;
   providing an interconnect region carried by the support substrate, the interconnect region including a capacitor and conductive line in communication with the first electronic circuit;
   providing a bonding layer carried by the interconnect region; and
   coupling a bonded substrate to the interconnect region through the bonding layer.

20. The method of claim 19, wherein the step of coupling includes forming a bonding interface.

21. The method of claim 19, wherein the step of coupling includes forming a metal-semiconductor bonding interface.

22. The method of claim 19, further including decoupling the bonded substrate from a carrier substrate.

23. The method of claim 19, further including forming a second electronic circuit proximate to a detach layer surface of the bonded substrate.

24. The method of claim 23, further including providing a second interconnect region which provides communication between the second electronic circuit and conductive line.

* * * * *